(12) United States Patent
Wiedmann

(10) Patent No.: US 7,123,071 B2
(45) Date of Patent: Oct. 17, 2006

(54) METHOD AND DEVICE FOR PRODUCING DELAYED SIGNALS

(75) Inventor: Frank Wiedmann, Freising (DE)

(73) Assignee: Infineon Technologies AG, (DE)

( * ) Notice: Subject to any disclaimer, the term of this patent is extended or adjusted under 35 U.S.C. 154(b) by 108 days.

(21) Appl. No.: 10/756,838

(22) Filed: Jan. 13, 2004

(65) Prior Publication Data

US 2004/0150452 A1    Aug. 5, 2004

(30) Foreign Application Priority Data

Jan. 15, 2003    (DE) ................. 103 01 239

(51) Int. Cl.
*H03H 11/26*    (2006.01)

(52) U.S. Cl. ............................. 327/263; 327/269

(58) Field of Classification Search ........... 327/261, 327/263, 266, 269–277, 284, 291, 295, 113–121, 327/141, 144, 145, 153, 161
See application file for complete search history.

(56) References Cited

U.S. PATENT DOCUMENTS

| | | | |
|---|---|---|---|
| 4,845,437 A | 7/1989 | Mansur et al. | 327/145 |
| 4,868,514 A | 9/1989 | Azevedo et al. | 327/159 |
| 5,563,554 A | 10/1996 | Mizuno | 331/51 |
| 5,614,841 A | 3/1997 | Marbot et al. | 326/52 |
| 5,638,016 A * | 6/1997 | Eitrheim | 327/175 |
| 5,686,855 A * | 11/1997 | Lee | 327/378 |
| 5,781,056 A * | 7/1998 | Fujii | 327/276 |
| 5,889,435 A * | 3/1999 | Smith et al. | 331/1 A |
| 6,028,462 A * | 2/2000 | Kyles | 327/277 |
| 6,285,226 B1 * | 9/2001 | Nguyen | 327/175 |
| 6,480,045 B1 * | 11/2002 | Albean | 327/119 |
| 2004/0234017 A1 * | 11/2004 | Tomerlin et al. | 375/354 |

FOREIGN PATENT DOCUMENTS

| | | |
|---|---|---|
| DE | 3623051 A1 | 1/1987 |
| DE | 69327612 T2 | 11/1993 |
| DE | 69418012 T2 | 6/1995 |
| DE | 69418987 T2 | 6/1995 |
| DE | 19532910 C2 | 3/1996 |
| EP | 0570158 B1 | 11/1993 |
| EP | 0841751 A1 | 5/1998 |
| EP | 0917290 B1 | 5/1999 |

* cited by examiner

*Primary Examiner*—Minh Nguyen
(74) *Attorney, Agent, or Firm*—Dicke, Billig & Czaja, P.L.L.C.

(57) ABSTRACT

In order to generate an output signal delayed compared to an input signal and with a defined mark-to-space ratio, it is useful to produce at least first and second intermediate signals delayed differently with respect to the input signal and to combine them to form the output signal so that a rising (or negative) edge of the first intermediate signal determines a rising edge of the output signal, and a rising (or negative) edge of the second intermediate signal determines a falling edge of the output signal. In particular a plurality of successive versions of an input timing signal delayed by an equal amount can be generated with a mark-to-space ratio of 50%.

24 Claims, 5 Drawing Sheets

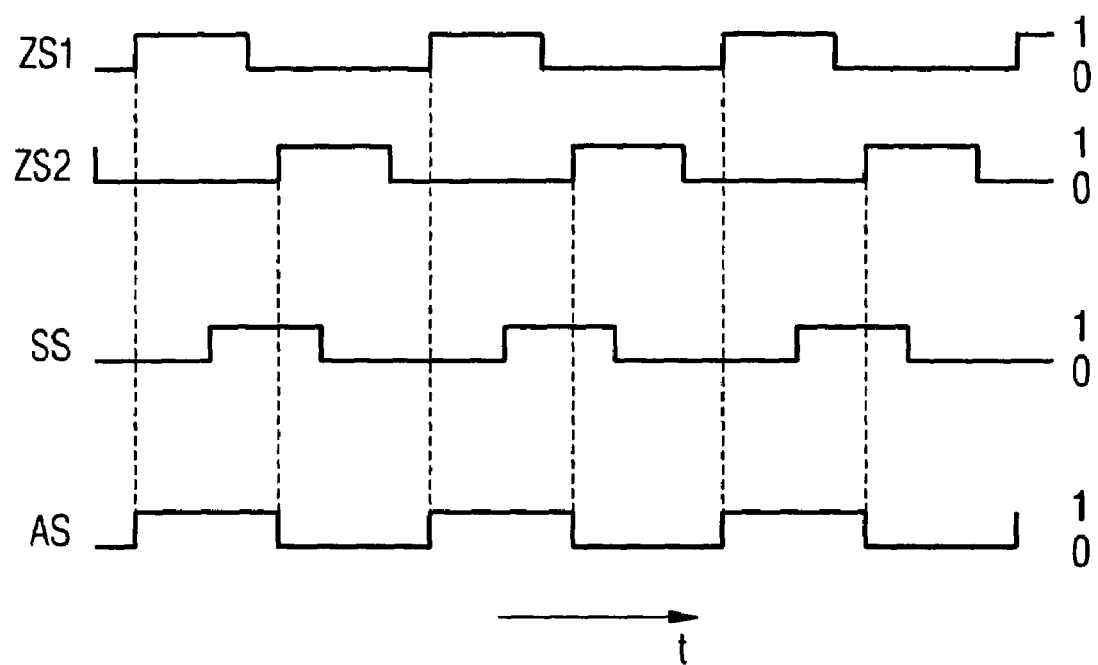

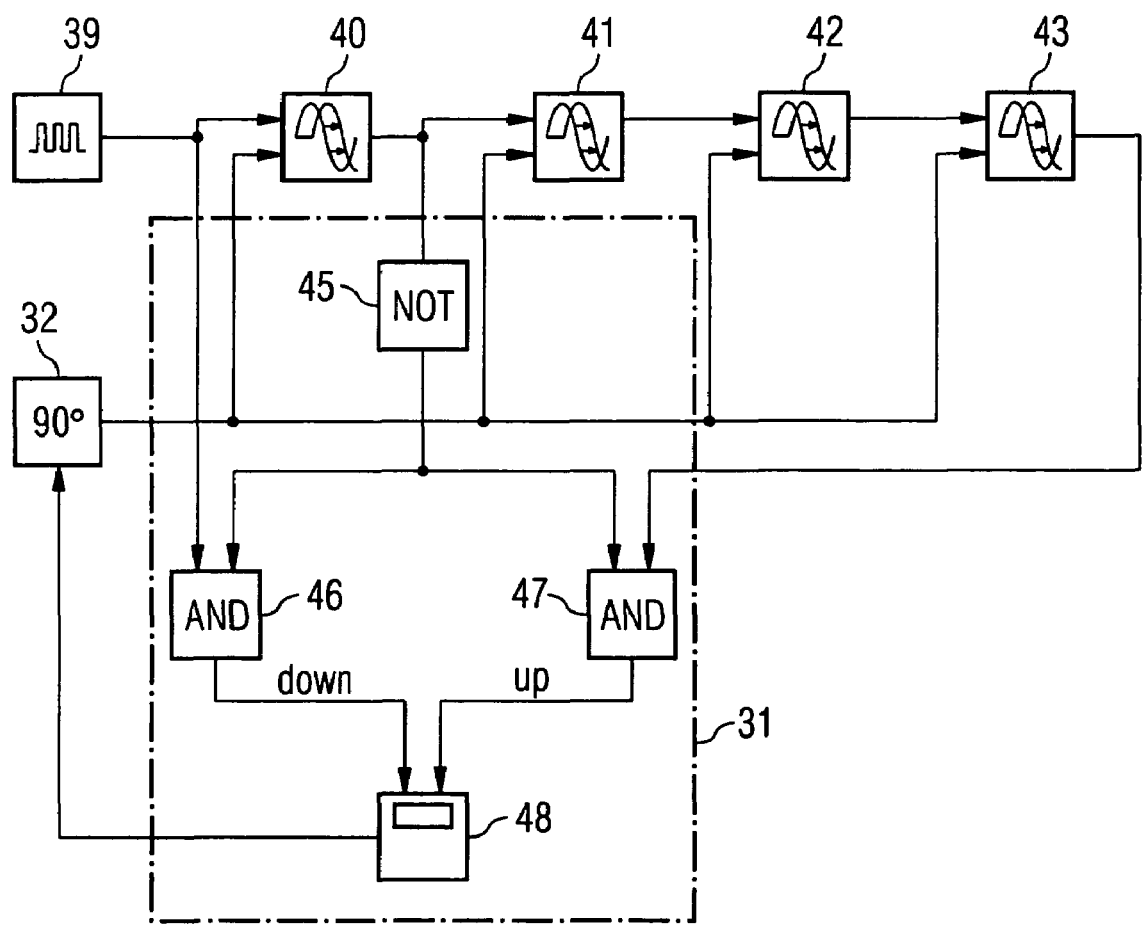

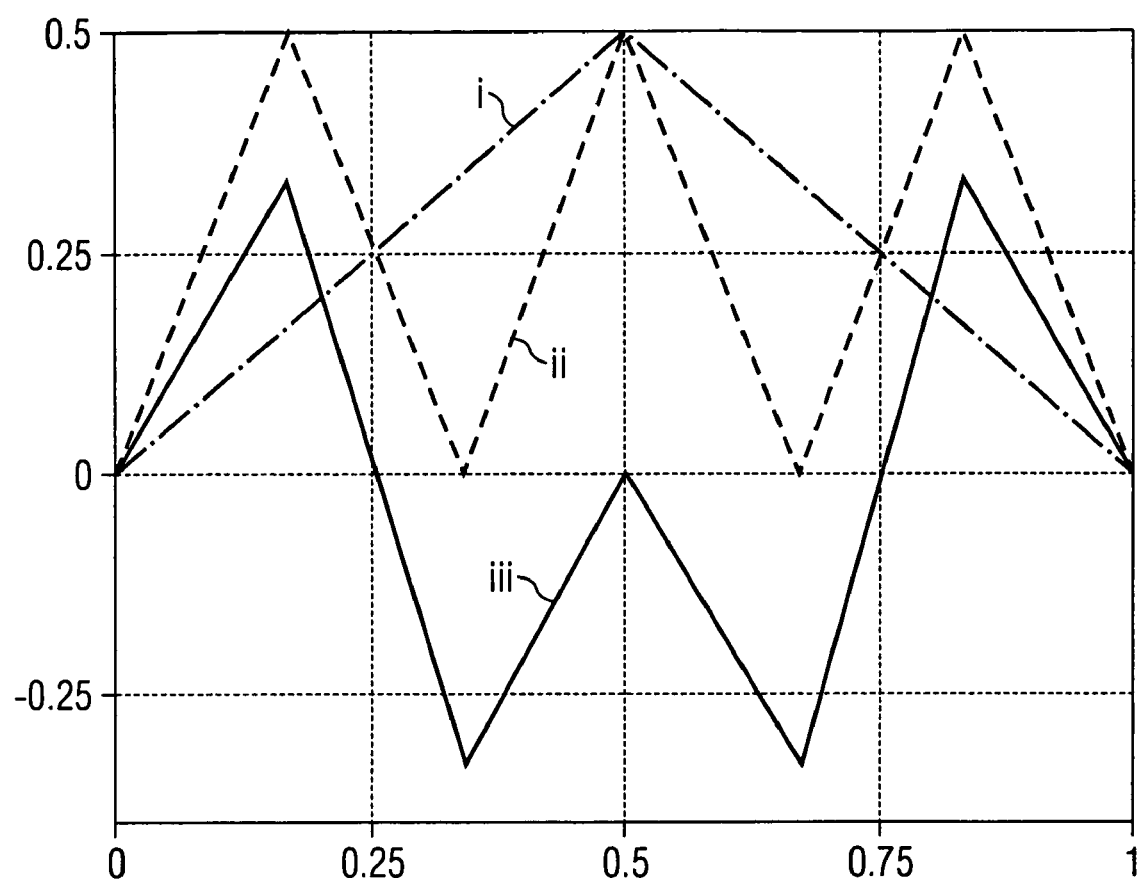

METHOD AND DEVICE FOR PRODUCING DELAYED SIGNALS

CROSS-REFERENCE TO RELATED APPLICATIONS

This Utility Patent Application claims priority to German Patent Application No. DE 103 01 239.7, filed on Jan. 15, 2003, which is incorporated herein by reference.

BACKGROUND

The present invention relates to a method and a device for producing an output signal that is delayed compared to an input signal. In particular the invention relates to a method and a device for producing a plurality of output signals that are in each case delayed by a defined phase angle compared to an input signal, and that have a mark-to-space ratio of for example 50%.

For the purposes of data recovery by oversampling, many versions of an input timing signal delayed by identical times or phase angles are required, with which various sampling elements can be controlled. In order not to let the number of signals become too high, it is desirable to be able to initiate a sampling procedure with the rising edge as well as with the falling edge of each signal. For this purpose it is necessary that the signals have an accurately defined mark-to-space ratio, in particular a mark-to-space ratio of 50%.

In order to delay the input timing, delay elements are generally employed. On account of process-conditioned differences between the components in the delay elements, however, the mark-to-space ratio deviates from the desired value, however, for example by 50%. This deviation becomes increasingly larger in the course of a chain of delay elements since the errors to some extent add up. In addition, there is the deviation that arises if the input signal of the chain already deviates from the desired value, for example by 50%.

With a relatively large number of delay elements, the mark-to-space ratio at the end of the chain deviates to such an extent from the desired value that it is no longer possible to use the rising edge as well as the falling edge of the signal since the result would be too inaccurate.

In principle, it would be possible to regulate the mark-to-space ratio actively. This means, however, a high switching expenditure in the case of high frequencies in some cases above 1 GHz, as are required for oversampling at high data rates.

SUMMARY

One embodiment of the present invention provides a method and a device with which a signal that is delayed compared to an input signal can be generated with an accurate predetermined mark-to-space ratio.

According to one embodiment of the invention, it is proposed to form at least two intermediate signals that are delayed by different amounts compared to an input signal and then to combine a first intermediate signal and a second intermediate signal different therefrom, of these intermediate signals, to form an output signal, in such a way that a rising edge of the output signal corresponds to a rising or falling edge of the first intermediate signal and a falling edge of the output signal corresponds to a rising or falling edge of the second intermediate signal. The mark-to-space ratio of the output signal is thereby defined by the delay between the first and the second intermediate signal.

In one embodiment, the delayed intermediate signals are formed by a delay chain, that is, by successive delay of the input signal. In order to form a plurality of output signals delayed in each case by the same times with a mark-to-space of 50%, 2k(k=1, 2 . . . ) successive intermediate signals delayed substantially by 360°/(2k) compared to the input signal are formed. Those intermediate signals whose delay with respect to one another is substantially 180° are then combined to form an output signal. These signals may be combined, for example, by a multiplexer in such a way that the respective multiplexer forms, depending on a control signal, the first intermediate signal or the second intermediate signal in inverted form as the output signal. A further one of the intermediate signals may be used in this connection as control signal. For a mark-to-space ratio of 50% an intermediate signal may be used that has an absolute delay of substantially 90° with respect to the first as well as to the second intermediate signal, that is, lies exactly between the first and the second intermediate signal. In order to obtain a greater accuracy of the emitted output signal, one embodiment employs a regulation in the form of a delay regulation loop or delay-locked loop (DLL). In this connection the delay of the intermediate signal is regulated so that the intermediate signal with the greatest delay experiences a delay of substantially 360° with respect to the input signal. In this way, when the delay chain described above is used the overall delay remains constant and a process variability of the individual delay elements is partially compensated.

The method and device according to one embodiment of the invention have the advantage that the delay caused by delay elements reacts less sensitively to the process variability than does the mark-to-space ratio. Since the mark-to-space ratio of the output signal is defined in the present invention by the delays of the intermediate signals, the mark-to-space ratio can thus be accurately adjusted.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 are examples of signal waveforms.

FIG. 4 illustrates a block diagram of a delay locked loop according to one embodiment of the invention.

FIG. 5 illustrates the waveform of regulating signals depending on the delay of the intermediate signals in the delay locked loop illustrated in FIG. 4.

DETAILED DESCRIPTION

Figure 1:
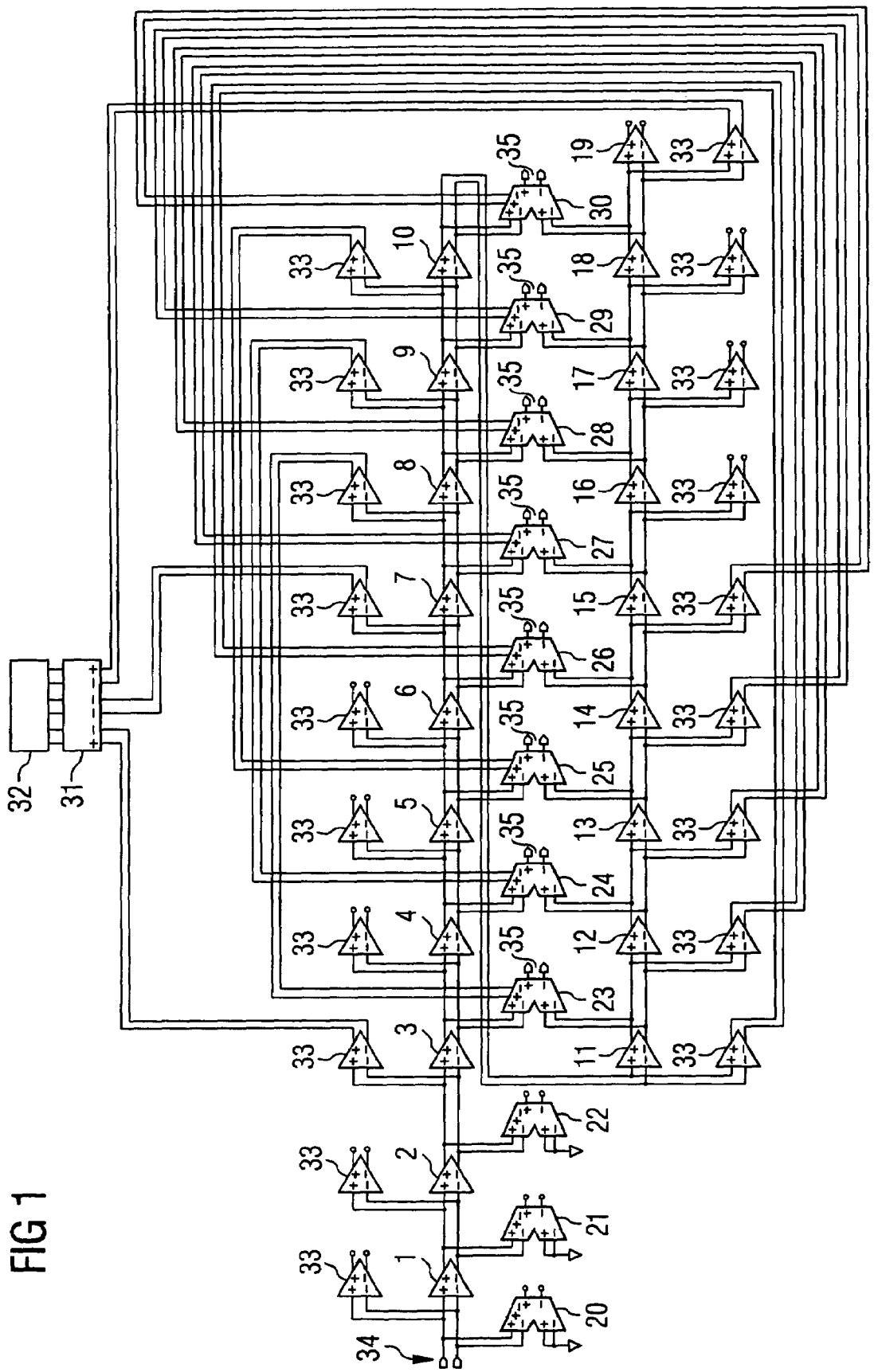
FIG. 1 illustrates a circuit diagram of an example of implementation of a device according to one embodiment of the invention.

The circuit diagram of a device according to one embodiment of the invention is illustrated in FIG. 1.

When the circuit is in operation an input timing signal is fed to a connection 34. The timing signal is delayed by a chain of nominally identical delay elements 1 to 19. For reasons of space, the chain of delay elements 1 to 19 is shown folded, whereas in one embodiment the actual implementation is realized in extended form, in which the lines corresponding to one another are as far as possible all be equally long and symmetrical.

Multiplexers 20 to 30 and buffers 33 are connected up to the delay elements 1 to 19 as illustrated in FIG. 1. The delayed output signals can be tapped at the outputs 35 of the multiplexers 23 to 30.

The first two delay elements 1 and 2 of the delay chain serve to form pulses. So that the zero passages have regular interspacings at all outputs 35, the signals within the chain should all have the same shape. Due to the combination of amplification and band limitation, in a chain of identical stages such a shape is already formed after a few stages, in the present case two stages, by the delay elements. So that all stages are actually identical, they must also be loaded identically. For this reason the multiplexers 20 and 21 and buffer stages 33 are also present when their output signals are not used. In the present example of implementation the loading due to these elements changes only slightly, however, when they are connected in a currentless manner. This is therefore effected in all elements, for example in the multiplexers 20 and 21, whose output signals are not used in the circuit. The actual input signal for the production of the delayed output signals is present at the output of the delay element 2.

The actual chain consists of the 16 delay elements 3 to 18. So that the last delay element 18 of this actual chain experiences the same load as the remaining elements 3 to 17, a delay element 19 is additionally present as load at the end of the chain. In the illustrated example of implementation the nominal delay of each delay element is 22.5° or 1/16 of a period, so that overall a delay of around 360° is achieved by the delay elements 3 to 18. In order to produce the output signals that are to be tapped at the outputs 35, in each case two delayed signals are combined by the multiplexers 23 to 30 to form a respective output signal.

Figure 2:
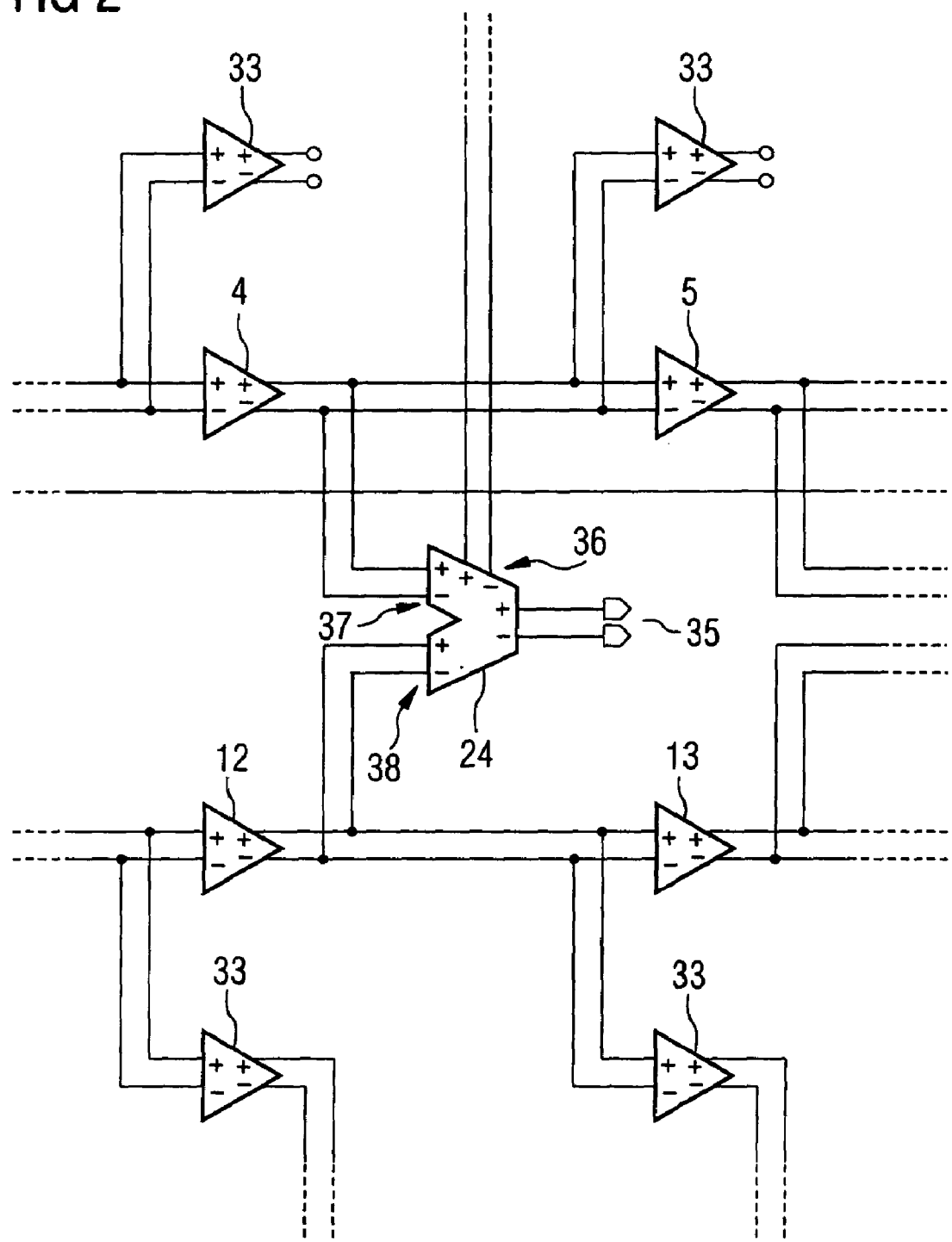
FIG. 2 illustrates an enlarged section of the circuit diagram illustrated in FIG. 1.

The interconnection of the multiplexers 23 to 30 is illustrated on an enlarged scale in FIG. 2 with the example of the multiplexer 24. In the illustrated section the signal after the delay element 4 is present at a first input 37 and the signal after the delay element 12 is present at a second input 38. In this connection the circuit connections are such that the signal after the delay element 12 is present inverted at the multiplexer 24, which may be effected in this case with differential signals by simply transposing the lines. Eight delay elements, that is, half of the actual chain, thus lie between the two signals present at the inputs 37 and 38. In the example discussed above, in which each delay element produces a delay of 22.5°, this means a delay of around 180° between the signal present at the input 37 and the signal present at the input 38.

In addition, a control signal is fed to the multiplexer 24 at a control input 36, which signal is tapped after the delay element 8, that is, exactly halfway between the delay element 4 and the delay element 12.

Possible signal waveforms at the inputs 36 to 38 and at the output 35 of the multiplexer 24 are illustrated in a time-dependent manner by way of example in FIG. 3.

In this connection, ZS1 denotes the first intermediate signal tapped after the delay element 4, which is fed to the multiplexer 24 at the input 37. ZS2 denotes the second intermediate signal tapped after the delay element 12, which is then fed in inverted form to the second input 38 of the multiplexer. The intermediate signals ZS1 and ZS2 have a phase shift of 180° with respect to one another.

In addition, a control signal SS is formed, which is tapped after the delay element 8 and is fed to the multiplexer at its control input 36. This is displaced by 90° with respect to the first intermediate signal ZS1 and is in advance of the second intermediate signal ZS2 by 90°. The multiplexer combines the first intermediate signal ZS1 and the second intermediate signal ZS2 now in such a way that, if the control signal has a logic value 0, the first intermediate signal ZS1 produces the output signal, whereas if the control signal SS has a logic value 1, the second intermediate signal ZS2 in inverted form forms the output signal. The waveform of the output signal is illustrated by AS in FIG. 3.

In the illustrated example the intermediate signals ZS1 and ZS2 that are formed from the input signal have a mark-to-space ratio that differs by 50%. The output signal AS has on the other hand a mark-to-space ratio of 50%. This is achieved by the delay of the intermediate signal ZS2 compared to the intermediate signal ZS1 of 180°, and of the control signal SS compared to the intermediate signal ZS1 of 90°. The control signal SS controls the multiplexer 24 so that a rising edge of the intermediate signal ZS1 results in a rising edge of the output signal AS, whereas a rising edge of the intermediate signal ZS2 results in a falling edge of the output signal AS.

Other delays between the intermediate signals and the control signal are also conceivable in order to produce an output signal with a different desired mark-to-space ratio. In addition, the circuitry may also be designed so that in each case the falling edges of the intermediate signals ZS1 and ZS2 determine the position of the edges of the output signal AS.

It should also be noted in this connection that the frequency is not altered by the combination of the signals ZS1 and ZS2, that is, the output signal AS has the same frequency as the intermediate signals ZS1 and ZS2 produced from the input signal. The mark-to-space ratio, however, can be adjusted due to the delay.

FIG. 1 additionally illustrates a phase detector 31 that controls a charge pump 32. The charge pump in turn controls the delay of the delay elements 1 to 19. The control lines required for this purpose are for reasons of clarity not shown in FIG. 1. This arrangement forms a delay regulation system (delay locked loop, DLL). In one embodiment, the regulation is performed in such a way that overall a delay of 360°, that is, a complete period is achieved through the delay elements 3 to 18. In this way a rising edge of the input signal present at the delay element 3 of the actual delay chain covers a rising edge of the signal present after the delay element 18. In the illustrated example of implementation the phase detector 31 receives as input signal the signal before the delay element 3, that is, the input signal of the actual delay chain (which consists of the delay elements 3 to 18), an intermediate signal that is tapped after the delay element 6, that is, after a quarter of the chain, and the intermediate signal after the delay element 18, that is, at the end of the chain. These signals are fed to the phase detector 31, in each case via buffers 33.

FIG. 4 illustrates an example of implementation of a delay regulation system such as may be used for example in the example of implementation illustrated in FIG. 1.

In FIG. 4 the delay chain of FIG. 1 is illustrated in simplified form. For the simplified representation in each case four delay elements of the actual delay chain consisting of the delay elements 3 to 18 are shown combined as delay blocks 40, 41, 42 and 43. Each of these delay blocks delays the signal nominally by a quarter period, or by 90°. An input signal 39 is fed to this delay chain, the signal corresponding in FIG. 1 to the signal present before the delay element 3. The phase detector 31 substantially comprises three logic elements, an NOT element 45 and two AND elements 46 and 47. The input signal 39, the intermediate signal at the end of the delay chain, that is, with the largest delay, after the delay block 43 and a further intermediate signal after the delay block 40 are fed to the phase detector. Two delay regulation signals are generated by the logic elements 45 to 47. The AND element 46 emits a first delay regulation signal ("down signal"), which indicates that the overall delay should be corrected downwardly. The AND element 47 emits a second delay regulation signal ("up signal"), which specifies that the overall delay of the delay chain should be corrected upwardly. Depending on the supplied signals, the delay regulation signals appear as illustrated in the following table:

| Input Signal | Further Intermediate Signal | Intermediate Signal with Greatest Delay | First Delay Regulation Signal | Second Delay Regulation Signal |
|---|---|---|---|---|
| 0 | 0 | 0 | 0 | 0 |
| 1 | 0 | 0 | 1 | 0 |
| 0 | 1 | 0 | 0 | 0 |
| 0 | 0 | 1 | 0 | 1 |
| 1 | 1 | 0 | 0 | 0 |
| 1 | 0 | 1 | 1 | 1 |
| 0 | 1 | 1 | 0 | 0 |
| 1 | 1 | 1 | 0 | 0 |

These delay regulation signals are passed on further by an element 48 to the charge pump 32. The charge pump 32 in turn controls the delay blocks 40 to 43 and the delay elements 1 to 19. This control and regulation is carried out in such a way that the overall delay of the delay elements 40 to 43 is 360°. Since the delay elements are nominally identical, the delay of each individual delay element 40 to 43 is substantially 90°, and of each individual delay element 1 to 19 is substantially 22.5°.

The characteristics of the phase detector are illustrated in FIG. 5. The waveforms of the delay regulation signals and of an overall or effective delay regulation signal resulting therefrom are shown as a function of the delay of a delay block.

In each case, the on period of the delay regulation signal is plotted in relation to the period duration over the phase delay of a delay block with four delay elements, in which the characteristic line (i) corresponds to the first delay regulation signal, the characteristic line (ii) corresponds to the second delay regulation signal and the characteristic line (iii) corresponds to the effective or overall delay regulation signal resulting therefrom.

It should be noted that the linear waveform of the overall delay regulation signal is around 90° or 0.25. This means a regulation to the value of 0.25 or 90° for the individual delay blocks. The phase detector delivers a signal of correct polarity up to at least approximately double the nominal delay. Due to production variations it could happen that the unstable operating point of the system in the case of double the nominal delay becomes a stable operating point. The output signal of the phase detector is proportional to the deviation as long as the delay deviates less than a third of the nominal value.

It should be noted that in principle other forms of embodiment of the delay locked loop are of course also conceivable. Due to the fact that the overall delay is regulated to 360°, process deviations of the individual delay elements are less strongly manifested in the output signal.

What is claimed is:

1. A method for producing an output signal that is delayed compared to an input signal, comprising:
   forming at least first and second intermediate signals delayed differently with respect to an input signal including regulating delay so that the intermediate signal with the largest delay experiences a delay of around 360° compared to the input signal; and
   combining the first and second intermediate signals to form an output signal having each rising edge determined by a corresponding edge transitioning in a first direction of the first intermediate signal and having each falling edge determined by a corresponding edge transitioning in the first direction of the second intermediate signal.

2. The method according to claim 1, wherein said forming step includes performing successive delay of the input signal to form the first and second intermediate signals.

3. The method according to claim 1, including delaying an input timing signal to obtain the input signal.

4. The method of claim 1 wherein the corresponding edge of the first intermediate signal and the corresponding edge of the second intermediate signal transition in a rising direction.

5. The method of claim 1 wherein the corresponding edge of the first intermediate signal and the corresponding edge of the second intermediate signal transition in a falling direction.

6. A method for producing output signals that are delayed compared to an input signal, comprising:
   forming intermediate signals respectively delayed compared to the input signal including forming at least first and second intermediate signals delayed differently with respect to the input signal; and
   combining pairs of the intermediate signals whose delay relative to one another is around 180° to form respectively corresponding output signals wherein combining one pair of the intermediate signals includes combining the first and second intermediate signals to form one of the output signals having a rising edge that corresponds to an edge of the first intermediate signal and having a falling edge that corresponds to an edge of the second intermediate signal.

7. The method according to claim 6, wherein the combining one pair of the intermediate signals includes, in response to a control signal, using one of the first intermediate signal and an inversion of the second intermediate signal to form the one of the output signals.

8. The method according to claim 7, wherein said forming step includes forming 2k intermediate signals respectively delayed around 360°/(2k) compared to the input signal, wherein k is an even number and the control signal is one of the intermediate signals that has an absolute delay of around 90° with respect to both the first intermediate signal and the second intermediate signal.

9. A method for producing an output signal that is delayed compared to an input signal, comprising:
   forming at least first and second intermediate signals delayed differently with respect to an input signal, wherein said forming step includes regulating delay depending on the input signal, the intermediate signal with the largest delay, and a further one of the intermediate signals; and combining the first and second intermediate signals to form an output signal having a rising edge that corresponds to an edge of the first intermediate signal and having a falling edge that corresponds to an edge of the second intermediate signal.

10. The method according to claim 9, wherein the further intermediate signal has a delay of around 90° compared to the input signal.

11. The method according to claim 9, wherein said regulation step includes a first delay regulation signal reducing the delay of all intermediate signals, and a second delay regulation signal increasing the delay of all intermediate signals.

12. Method according to claim 11, wherein said regulating step includes generating the delay regulation signals according to the following relationship

| Input Signal | Further Intermediate Signal | Intermediate Signal with Greatest Delay | First Delay Regulation Signal | Second Delay Regulation Signal |
|---|---|---|---|---|
| 0 | 0 | 0 | 0 | 0 |
| 1 | 0 | 0 | 1 | 0 |
| 0 | 1 | 0 | 0 | 0 |
| 0 | 0 | 1 | 0 | 1 |
| 1 | 1 | 0 | 0 | 0 |
| 1 | 0 | 1 | 1 | 1 |
| 0 | 1 | 1 | 0 | 0 |
| 1 | 1 | 1 | 0 | 0 | wherein 1 corresponds to a first signal level and 0 corresponds to a second signal level.

13. A method for producing an output signal that is delayed compared to an input signal, comprising:

forming at least first and second intermediate signals delayed differently with respect to an input signal; and combining the first and second intermediate signals to form an output signal having a rising edge that corresponds to an edge of the first intermediate signal and having a falling edge that corresponds to an edge of the second intermediate signal, wherein said combining step includes, in response to a control signal, using one of the first intermediate signal and an inversion of the second intermediate signal to form the output signal.

14. The method according to claim 13, wherein the control signal is one of the intermediate signals that has an absolute delay of around 90° with respect to both the first intermediate signal and the second intermediate signal.

15. A device for producing an output signal that is delayed compared to an input signal, comprising:

an input for receiving the input signal;

at least first and second delay elements coupled to the input for producing respective first and second intermediate signals in response to the input signal; and a circuit comprising a multiplexer connected to the delay elements to form from the first and second intermediate signals an output signal having each rising edge determined by a corresponding edge transitioning in a first direction of the first intermediate signal and having each falling edge determined by a corresponding edge transitioning in the first direction of the second intermediate signal.

16. The device according to claim 15, wherein the delay elements are connected in series.

17. The device according to claim 15, wherein the first delay element successively delays the input signal to form the first intermediate signal and the second delay element successively delays the input signal to form the second intermediate signal.

18. The device of claim 15 wherein the corresponding edge of the first intermediate signal and the corresponding edge of the second intermediate signal transition in a rising direction.

19. The device of claim 15 wherein the corresponding edge of the first intermediate signal and the corresponding edge of the second intermediate signal transition in a falling direction.

20. A device for producing an output signal that is delayed compared to an input signal, comprising:

an input for receiving the input signal;

delay elements connected in series for producing respective intermediate signals, the delay elements including at least first and second delay elements coupled to the input for producing respective first and second intermediate signals in response to the input signal; and circuits connected to the delay elements, each of the circuits for receiving a pair of the intermediate signals that are delayed with respect to one another by around 180° and for forming therefrom a corresponding output signal, wherein one of the k circuits is connected to the delay elements to form from the first and second intermediate signals an output signal having a rising edge that corresponds to an edge of the first intermediate signal and having a falling edge that corresponds to an edge of the second intermediate signal.

21. The device of claim 20 wherein each of the delay elements produce a delay of around $360°/(2k)$, wherein k is a natural number.

22. A device for producing an output signal that is delayed compared to an input signal, comprising:

an input for receiving the input signal;

at least first and second delay elements coupled to the input for producing respective first and second intermediate signals in response to the input signal, wherein the delay elements are controllable, and including a delay regulation device coupled to the delay elements for controlling the delay elements so that the intermediate signal with the largest delay has a delay of around 360° compared to the input signal; and a circuit connected to the delay elements to form from the first and second intermediate signals an output signal having each rising edge determined by a corresponding edge transitioning in a first direction of the first intermediate signal and having each falling edge determined by a corresponding edge transitioning in the first direction of the second intermediate signal.

23. A device for producing an output signal that is delayed compared to an input signal, comprising:

an input for receiving the input signal;

at least first and second delay elements coupled to the input for producing respective first and second intermediate signals in response to the input signal; and a circuit connected to the delay elements to form from the first and second intermediate signals an output signal having each rising edge determined by a corresponding edge transitioning in a first direction of the first intermediate signal and having each falling edge determined by a corresponding edge transitioning in the first direction of the second intermediate signal, wherein the output signal is formed from the first intermediate signal and an inversion of the second intermediate signal.

24. A device for producing an output signal that is delayed compared to an input signal, comprising:
- an input for receiving the input signal;
- at least first and second delay elements coupled to the input for producing respective first and second intermediate signals in response to the input signal;
- a delay regulator configured to regulate delay of the delay elements based on the input signal, the intermediate signal with the largest delay, and a further one of the intermediate signals; and
- a circuit connected to the delay elements to form from the first and second intermediate signals an output signal having a rising edge that corresponds to an edge of the first intermediate signal and having a falling edge that corresponds to an edge of the second intermediate signal.

* * * * *